US007242783B1

(12) United States Patent
Weeks et al.

(10) Patent No.: US 7,242,783 B1
(45) Date of Patent: Jul. 10, 2007

(54) AUDIO LIMITING CIRCUIT

(75) Inventors: William A. Weeks, Santa Cruz, CA (US); William R. Morrell, Santa Cruz, CA (US)

(73) Assignee: Plantronics, Inc., Santa Cruz, CA (US)

( * ) Notice: Subject to any disclaimer, the term of this patent is extended or adjusted under 35 U.S.C. 154(b) by 14 days.

(21) Appl. No.: 11/340,239

(22) Filed: Jan. 25, 2006

Related U.S. Application Data

(63) Continuation of application No. 10/040,922, filed on Dec. 28, 2001, now Pat. No. 7,013,011.

(51) Int. Cl.
H03G 5/00 (2006.01)
H03G 3/00 (2006.01)
G10L 19/14 (2006.01)

(52) U.S. Cl. ............... 381/98; 381/107; 381/99; 381/104; 704/224; 704/225

(58) Field of Classification Search ............... 381/98, 381/99, 107, 104; 704/224, 225
See application file for complete search history.

(56) References Cited

U.S. PATENT DOCUMENTS

| 4,454,609 | A | * | 6/1984 | Kates ................. 381/320 |
| 4,703,507 | A | * | 10/1987 | Holden ................ 381/94.5 |
| 5,027,410 | A | * | 6/1991 | Williamson et al. ...... 381/320 |
| 5,204,677 | A | * | 4/1993 | Akagiri et al. ........... 341/118 |
| 5,371,803 | A | * | 12/1994 | Williamson, III ....... 381/104 |
| 5,701,352 | A | * | 12/1997 | Williamson, III ....... 381/104 |
| 5,892,833 | A | * | 4/1999 | Maag et al. ............. 381/98 |
| 6,535,846 | B1 | * | 3/2003 | Shashoua ............... 704/225 |
| 6,865,274 | B1 | * | 3/2005 | Aarts et al. ............ 381/55 |

\* cited by examiner

*Primary Examiner*—Vivian Chin
*Assistant Examiner*—Devona E. Faulk
(74) *Attorney, Agent, or Firm*—Thomas Chuang

(57) ABSTRACT

An audio limiting circuit capable of satisfying frequency dependent limits and time domain constraints, is disclosed. In one illustrative embodiment, an input node receives an unattenuated input signal and a system modeling filter predicts the amount, if any, by which the sound pressure level that would be generated by an acoustic transducer in response to the unattenuated input signal, would exceed one or more predetermined limits. In that embodiment, an energy detector separates the excess predicted sound pressure level into one or more frequency bands and calculates the average acoustic energy associated with each band. A gain logic block determines an attenuation factor based on whether one or more of the predetermined limits has been exceeded and the attenuation factor values are smoothed to minimize abrupt changes to the unattenuated input signal. A delay buffer delays the unattenuated input signal values. Finally, in the embodiment described here, the smoothed attenuation factor values are synchronized with and applied to the delayed input signal values and the resulting attenuated signal is transmitted to an output node and ultimately to one or more acoustic transducers.

6 Claims, 9 Drawing Sheets

Fig. 2 - Data Flow

Fig. 5 - Logic for one Embodiment of Average Energy Detector

Fig. 6 - One Embodiment of Sustained Gain Calculator

Fig. 8—Sample Frequency & Time Domain Limiting Requirements

AUDIO LIMITING CIRCUIT

CROSS REFERENCE TO RELATED APPLICATION

This is a Continuation of our Commonly Assigned, Co-Pending U.S. patent application Ser. No. 10/040,922 filed Dec. 28, 2001 now U.S. Pat. No. 7,013,011.

BACKGROUND

A. Field of the Invention

This invention relates to the fields of acoustic engineering and digital signal processing, and more particularly to techniques for filtering and limiting acoustic signals, so as to maintain the sound pressure levels and acoustic energy associated with such signals within certain predetermined limits.

B. Description of the Related Art

Advanced telecommunication headsets and their related circuitry typically provide some method of limiting the maximum sound level that the speakers can produce. Traditional approaches to implementing these limiting circuits have focused on limiting the peak voltage of very fast transient signals as well as limiting signals sustained above a reference level over longer time periods. These signals are electrical representations of the desired acoustic signal.

Existing products and techniques implement signal limiting using analog circuitry such as diodes to provide instantaneous peak limits on the amplifier output voltage. However, maintaining sound levels below certain predetermined limits by limiting the instantaneous peak voltage using diodes causes significant distortion over a wide range of signal levels. For example, in order to insure that an acoustic signal never exceeds a sound pressure level of 110 dB using diodes to limit the instantaneous peak voltage, non-linear effects begin at a level far below the desired limiting level. The result is a degradation of sound quality of the acoustic signal at a level where linearity is desired.

Additionally, existing analog techniques have utilized gain control circuits that respond to predetermined input signal threshold levels with a predetermined time constant for their gain adjustment. Such gain adjustments limit output voltage to a predetermined level after a time interval referred to as the attack time, once the threshold is exceeded. Threshold limits are usually based on peak value of the input signal. In one prior art example, diodes limit peak levels in less than a microsecond by simple clipping, a gain control circuit reduces peak output to a lower level after a first attack time is exceeded (tuned to the timing of speech peaks) and if the threshold continues to be exceeded after a second longer attack time (tuned to the longer periodicity of continuous tones), output signal is reduced to a still lower level. See U.S. Pat. No. 4,928,307 as an example of this technique.

Such existing methods of limiting acoustic signals rely on peak or average threshold detection over a broad frequency range. Consequently, the output level of the signal is limited according to the total acoustic energy contained in the signal. However, the level of the input signal that is uncomfortable is dependent on the frequency content of the signal. For example, low frequency signals (below 1000 Hz) can reach a higher level before the discomfort range of a listener is triggered. Normal speech is a wideband signal, with much of the frequency content below 1000 Hz. Broad band limiting of speech peaks can result in a very quiet output level when the speech is within the normal amplitude range.

Other existing sound level limiting methods provide for decreasing the sound level output in the event that a portion of the signal exceeds the average speech level, and many of these other methods provide low distortion limiting. However, these methods can fail to prevent unacceptably loud sounds from being produced by the output acoustic transducers such as speakers for short periods of time (on the order of 1 to 10 milliseconds).

Additionally, in 1999, Telstra Corporation Ltd, an Australian company, released its "TT4" specification. TT4 was developed to satisfy various regulatory agencies' desires to prevent acoustic disturbances resulting from being exposed to loud sounds.

The TT4 specification calls for frequency band specific limits in order to adequately protect users of headsets from sound levels that briefly become loud enough to trigger an acoustic disturbance. Implementing frequency dependent limits to sound pressure levels would be extremely difficult using existing analog techniques, and the TT4 specification does not provide any guidance or instruction as to how the proposed limits are to be achieved, but rather merely describes the desired results.

As an example, FIG. 8 illustrates a combination of frequency dependent limits and time domain constraints. In FIG. 8 there are three curves of sound pressure level (SPL) limits as a function of frequency. The three curves represent different measurement and time dependencies as follows. (1) The top most curve represents the maximum instantaneous SPL limits as measured with an instantaneous peak detector. These limits can never be exceeded. (2) The middle curve represents the maximum SPL levels as measured using an FFT analysis with 62.5 Hz resolution over a 16 ms window. (3) The lowest curve represents the long term or sustained limits. These sustained limits use the same 16 ms measurement technique as curve (2) and must be attained within 32 ms following an acoustic situation where the a signal continues to exceeded the limits of (2).

Thus, there is a need for a method to limit an acoustic signal without causing excessive delay or distortion to the sound produced by the acoustic signal, while ensuring that the sound produced from the signal does not exceed predetermined, frequency and time dependent limits.

SUMMARY OF THE INVENTION

The present invention limits the signal level driving, for example, an acoustic transducer, so that the sound pressure produced by the acoustic transducer does not exceed predetermined limits. A prediction is made of the amount by which the sound pressure levels that would be generated in response to an unattenuated input signal, would exceed predetermined limits, taking into account the performance characteristics of the particular devices used to convert the acoustic signal into sound, such as a digital-to-analog converter and headset loud speaker or other acoustic transducer. The excess predicted sound pressure level is analyzed in one or more frequency bands and the average acoustic energy associated with each frequency band is calculated. The excess predicted sound pressure levels are then used to calculate the amount by which to attenuate the unattenuated input signal in order to ensure that the actual sound pressure levels ultimately generated by the acoustic transducer do not exceed predetermined frequency and time domain limits.

One embodiment of the present invention employs digital signal processing techniques to limit the input signal. Additionally, by buffering the audio input signal and applying the gain calculated using the excess predicted sound pressure levels to the buffered input signal, the present invention is capable of smoothly attenuating the acoustic transducer's output sound pressure level while minimizing distortion and maintaining intelligibility. The present invention may be used in sound limiting circuitry used in connection with telecommunication headsets.

In one embodiment, the invention includes the combination of several digital signal processing elements including an input node, system modeling filter, a spectral energy detector, a delay buffer, a peak detector, a gain logic block, a gain smoother, a gain block and an output node. The input node receives an electrical representation of an unattenuated input signal. The system modeling filter predicts the sound pressure level that would be generated by an acoustic transducer based on the unattenuated input signal, taking into account the performance characteristics of the output transducer. In one embodiment the output transducer is an acoustic headset. In another embodiment, the output of the system modeling filter is the predicted sound pressure level. In another embodiment, the predicted sound pressure levels output from the system modeling filter are normalized based on a frequency-dependent sound pressure level limiting specification, such that the output of the system modeling filter is the amount by which the predicted sound pressure level exceeds the specified sound pressure level limit over a range of frequencies and time scales.

In one embodiment the spectral energy detector is comprised of a bandpass filter bank and an average energy detector bank. The bandpass filter bank separates the sound pressure level values into one or more frequency bands. The average energy detector bank determines the acoustic energy associated with each frequency band. The gain logic block calculates intermediate gain values based on whether the acoustic energy associated with each frequency band and the maximum instantaneous amplitude of the predicted sound pressure level exceed certain predetermined limits. The gain logic block then determines a target gain to apply to the unattenuated input signal. In one embodiment, the amount of attenuation applied is the minimum amount of attenuation necessary to comply with the predetermined limits. Other embodiments contemplated by the present invention include adjusting the amount of attenuation as needed to satisfy the requirements of the predetermined limits while increasing the quality and minimizing the distortion of the sound output by the acoustic transducer.

The gain smoother interpolates between two gain values: a target gain, calculated by the gain logic block, and a reference gain. The interpolated values are used to populate a buffer to smoothly transition the final gain between the target gain and the reference gain. This interpolation minimizes abrupt changes to the gain applied to the unattenuated input signal and reduces undesirable acoustic artifacts and distortion effects that might result from abrupt changes to the amount of attenuation applied to the input signal.

A delay buffer is used to delay the unattenuated input signal and the delayed input signal is synchronized with the smoothed gain values calculated by the gain smoother. The smoothed gain values are then applied to the delayed, unattenuated input signal in the gain block and the resulting attenuated signal is transmitted to the output node and ultimately, for example, to an acoustic transducer.

The features and advantages described in this summary and the following detailed description are not all-inclusive, and particularly, many additional features and advantages will be apparent to one of ordinary skill in the art in view of the drawings, specification, and claims hereof. Moreover, it should be noted that the language used in this disclosure has been principally selected for readability and instructional purposes, and may not have been selected to delineate or circumscribe the inventive subject matter, resort to the claims being necessary to determine such inventive subject matter.

BRIEF DESCRIPTION OF DRAWINGS

The figures depict preferred embodiments of the present invention for purposes of illustration only. One skilled in the art will readily recognize from the following discussion that alternative embodiments of the structures and methods illustrated herein may be employed without departing from the principles of the invention described herein.

DETAILED DESCRIPTION OF THE PREFERRED EMBODIMENT

In the following description, for purposes of explanation, numerous specific details are set forth in order to provide a thorough understanding of the invention. The arts of digital signal processing and acoustic engineering are such that many different variations of the illustrated and described features of the invention are possible. Those skilled in the art will undoubtedly appreciate that the invention can be practiced without some specific details described below, and indeed will see that many other variations and embodiments of the invention can be practiced while still satisfying the teachings of the invention.

Figure 1:
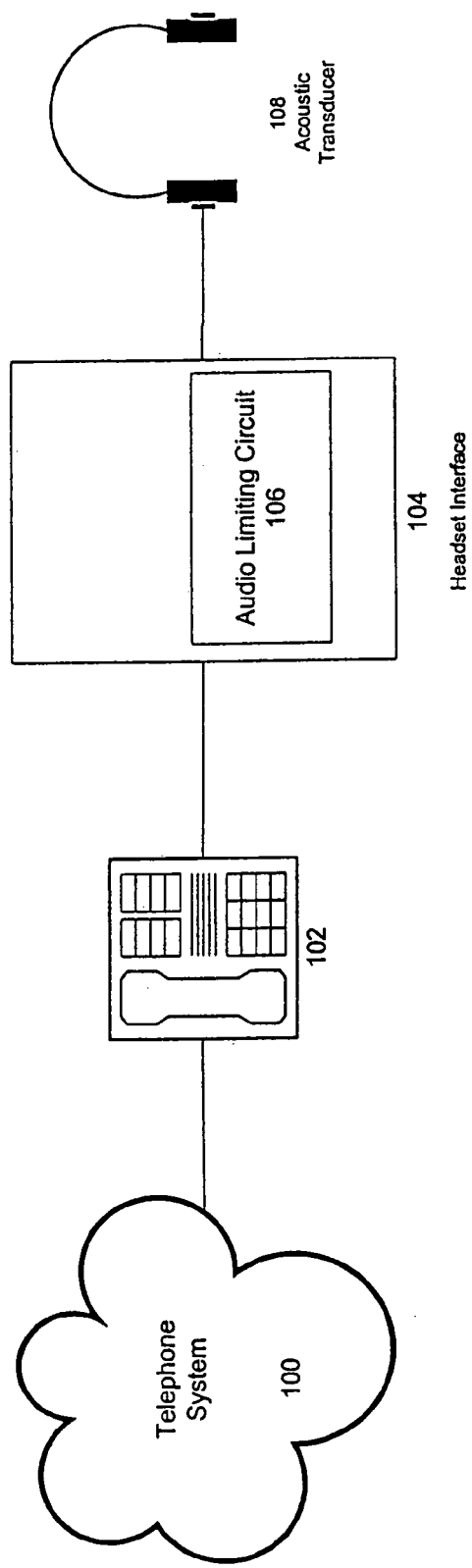
FIG. 1 is a drawing that shows one implementation of the present invention as incorporated into a telephone communication system including a headset.

FIG. 1 shows one implementation of the present invention in combination with a telephone communication system to provide audio signal limiting characteristics. A telephone 102, which itself is connected to a telephone network 100, is connected to a headset interface 104 containing an audio limiting circuit 106 in accordance with one embodiment of the present invention. The interface 104 couples the audio limiting circuit to an acoustic transducer 108, such as a communication headset, and enables certain standard interface functions such as volume control, muting, amplification or other similar functions. The details of the circuitry of the headset interface 104 as it pertains to these functions are well known and not material to the invention, and accordingly, are not discussed here, so as to avoid obscuring the invention. Suitable interfaces that may be modified to include the audio limiting circuit 106 or its equivalents include Plantronics Inc.'s M12 or A20 headset interfaces, or the like. In various embodiments contemplated by the present invention, the acoustic transducer could be in the form of a telephone, a headset, headphone, a speaker, or other device capable of producing sound in response to an electrical signal.

Figure 2:
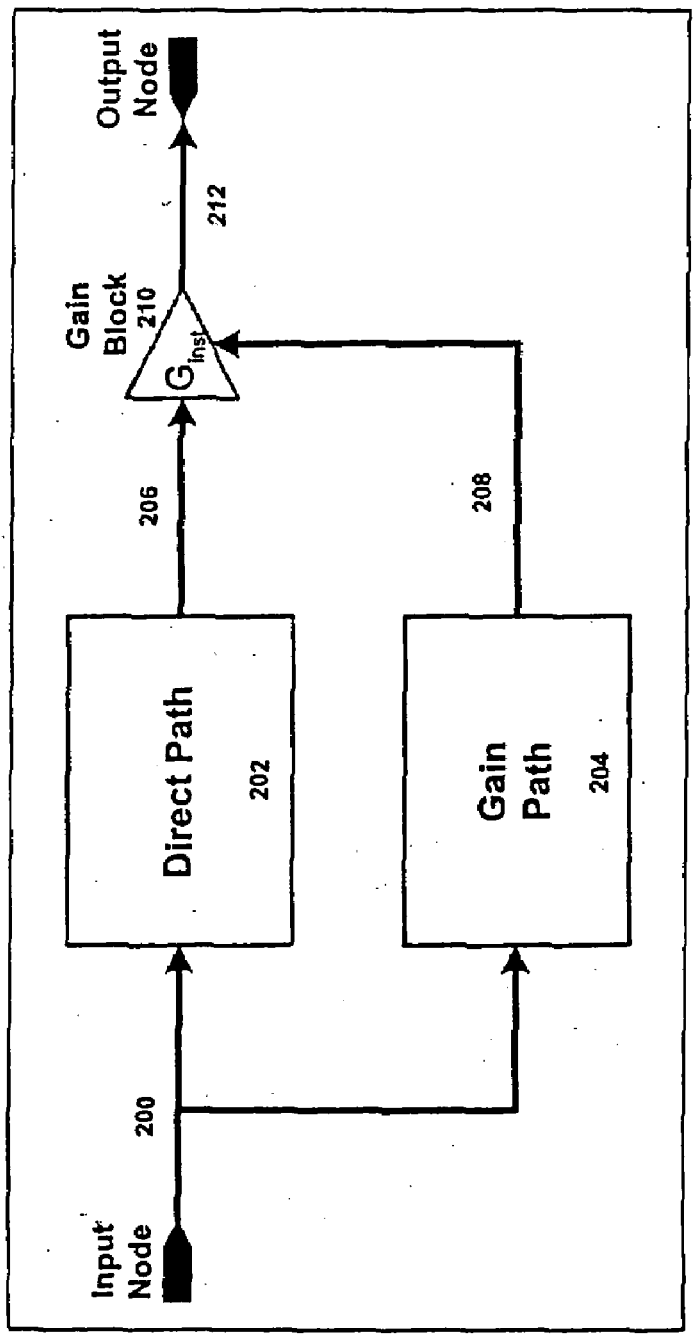
FIG. 2 is a block diagram that provides a high-level overview of the flow of data through one embodiment of the present invention.

Referring now to FIG. 2, a high level overview of the flow of data from an electrical representation of an acoustic signal through the major components of the audio limiting circuit 106 is depicted. An unattenuated electrical signal 200 (representing an acoustic signal) is received and passed to the direct path 202 and the gain path 204. Logic in the gain path 204 is used to analyze the unattenuated signal and determine whether the sound pressure level (measured at a user's ear) that would be generated by an acoustic transducer in response to the unattenuated signal would exceed certain predetermined limits. In the event that the sound pressure level would exceed the predetermined limits, a gain signal 208 is calculated which, when applied to the signal 206 passing through the direct path 202, would prevent the sound pressure level from exceeding the predetermined limits. The gain signal 208 is passed to the gain block 210 that applies the gain to the output signal 206 from the direct path and produces an attenuated signal 212 which complies with the requirements determined by the predetermined limits. In the event that the sound pressure level would not exceed the predetermined limits, the gain signal 208 is set to unity. The direct path 202 delays and buffers the input signal 200 in order to allow for the calculation of a gain in the gain path 204 to take place and to allow the gain to be applied to the signal in a manner which avoids abrupt changes to the input signal level which might produce undesirable acoustic artifacts in the sound produced by the attenuated signal 212.

Figure 3:
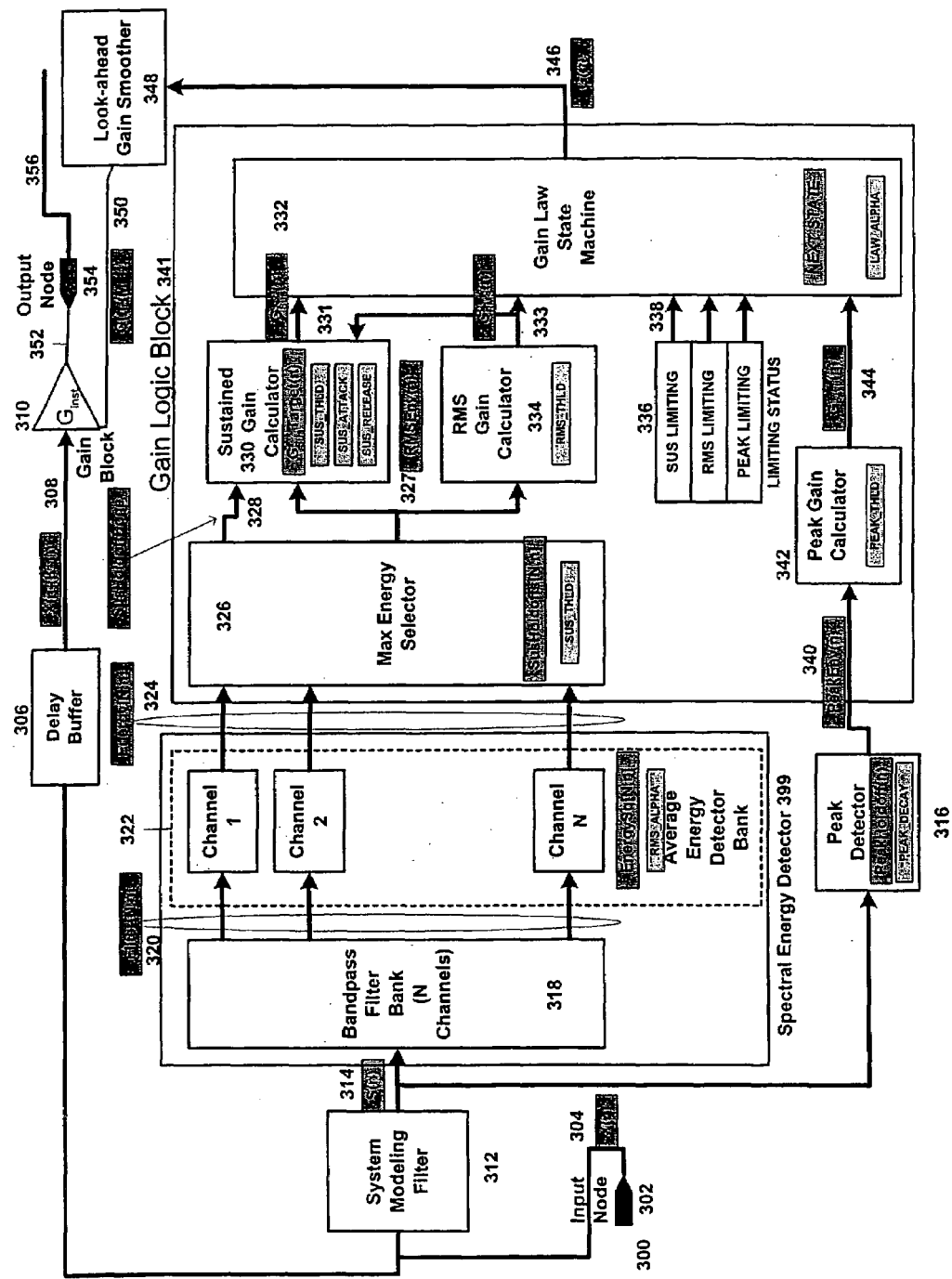
FIG. 3 is a block diagram illustrating the various components of one embodiment of the present invention.

Referring now to FIG. 3, a detailed block diagram is shown illustrating the various elements of one embodiment of the audio limiting circuit 106 implemented using a digital signal processing circuit. The inputs, outputs and functions of each element are described in detail below, and those of skill in the art will appreciate that the inputs and outputs in such an embodiment are represented in a digital format. In other embodiments, the audio limiting circuit may be implemented in analog circuitry, in which case the inputs and outputs are electrical signals.

Input Node

An unattenuated input signal 300 is received by the system modeling filter 312 and the delay buffer 306. In the preferred embodiment, the input signal is in the form of digital data that has been sampled at a rate of 8 kHz or faster and has a resolution of at least 16 bits.

Delay Buffer

The delay buffer 306 takes as input an unattenuated signal 304 and provides as output a delayed signal 308 from the unattenuated input signal. Delaying the input signal provides two benefits: First, the delay provides an amount of look-ahead time in which to calculate the amount of gain needed to attenuate the input signal such that the predetermined limits are not exceeded. Second, adding delay to the input signal makes it possible to smoothly vary the amount of attenuation applied to the signal while avoiding abrupt changes. One skilled in the art will appreciate that making abrupt changes to a signal which is passed to an acoustic transducer to generate sound, generally produces perceptible distortion and other undesired acoustic artifacts. In one preferred embodiment, the input signal is delayed by approximately 1.25 milliseconds.

System Modeling Filter

Figure 4:
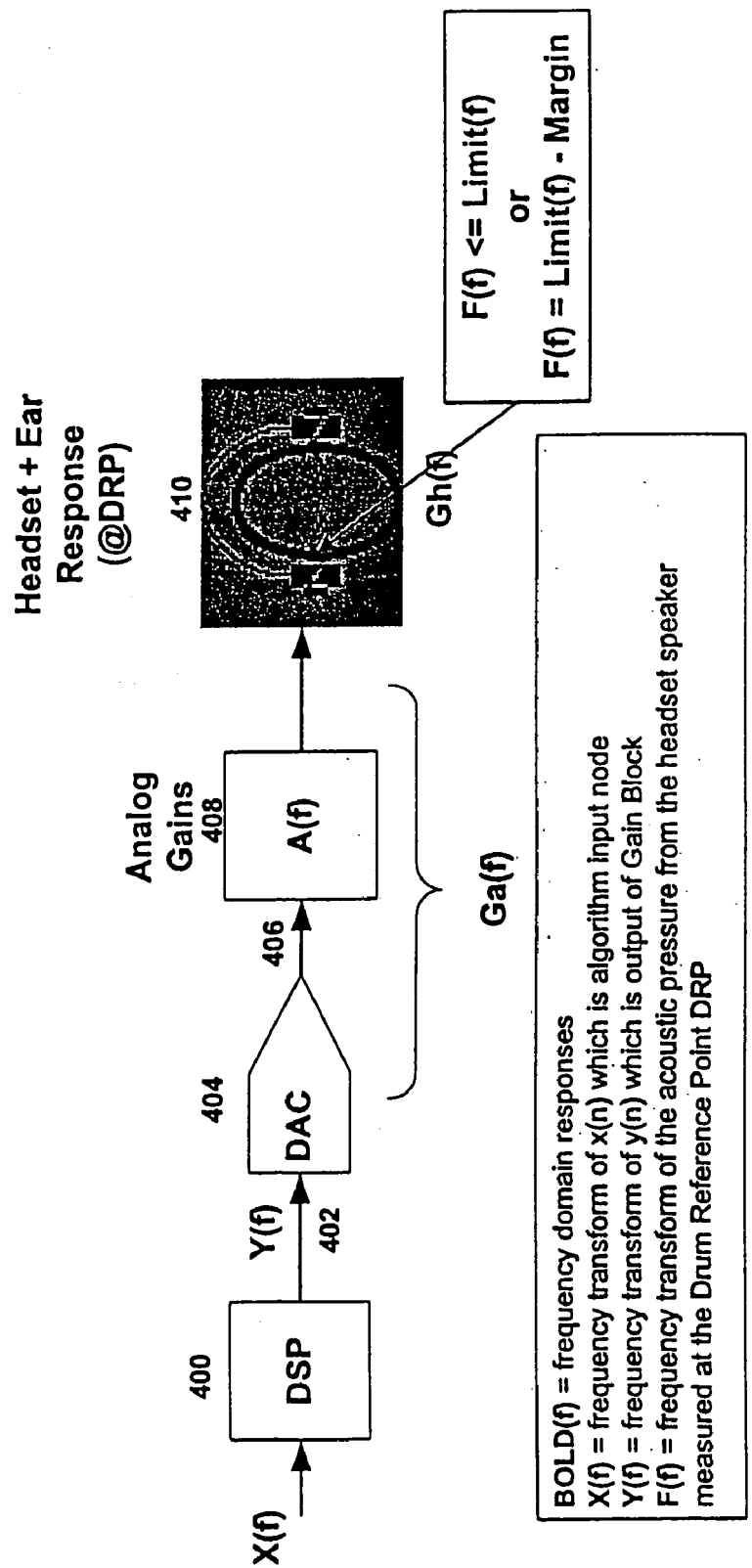
FIG. 4 is a block diagram showing the various physical system components modeled by one embodiment of the system modeling filter shown in FIG. 3.

The system modeling filter 312 receives as input an unattenuated signal 300 and predicts a sound pressure level at a location of sound reception of an acoustic signal that would be generated by an acoustic transducer in response to the unattenuated input signal. In one embodiment, the location of sound reception is the eardrum of a user using the acoustic output transducer to listen to the sound produced in response to an input signal to the transducer. In a further embodiment, predetermined limits are incorporated into the system modeling filter 312 such that the system modeling filter 312 predicts the excess amount, if any, by which the predicted sound pressure level exceeds the predetermined limits. In a further embodiment, the system modeling filter 312 may model the performance characteristics of a digital-to-analog converter 404, analog gains 408, and a headset (including ear coupling characteristics) 410, as illustrated in FIG. 4, as a frequency domain transfer function.

In one embodiment, the system modeling filter 312 is implemented as a cascade of standard second-order digital Infinite Impulse Response (IIR) filter sections. The coefficients for the IIR filter are determined by first modeling the digital-to-analog converter, the analog circuit elements, the acoustic transducer (e.g., headset) and the acoustic limiting requirements as a frequency domain transfer function, according to the following equation:

$$F(f) = Ga(f) + Gh(f) + \text{Margin}(f) - \text{Limit}(f)$$

Where:

| | |
|---|---|
| F(f) | represents the complete transfer function (in dB) from the DSP output to the headset's acoustic output |
| Ga(f) | represents the frequency domain transfer function in dB of the digital-to-analog converter and other analog elements in the system |
| Gh(f) | represents the frequency domain transfer function in dB from the headset electrical stimulus to the output acoustic pressure measured at the Drum Reference Point (DRP) |
| Margin(f) | represents a predetermined margin in dB as a function of frequency |
| Limit(f) | represents a predetermined limit (measured in dB) that the output sound pressure level at any given frequency must not exceed |

The resulting frequency domain transfer function F(f) is then used to generate a time domain linear filter that approximates the transfer function impulse response, f(t). Additionally the time domain impulse is converted to a set of numerical coefficients compatible with the target digital processor and filter realization.

In one embodiment of the system modeling filter the time domain transfer function of the impulse response, f(t), is obtained from F(f) by use of the Yule-Walker filter design method. The coefficients of the resulting Yule-Walker method are further transformed into coefficients for second order IIR sections called biquads. The biquad coefficients are then reformatted to have a level of the numerical precision that is compatible with a particular digital hardware realization. In one embodiment the digital hardware realization is effected with an Analog Devices ADSP2186 or a Texas Instruments TMS320C5402 DSP chip. It is fully anticipated that other processors, integrated circuits, and the like are and will be useful for the purposes of the invention, which equivalents may provide additional features not described here, that may simplify or enhance the operation of the present invention. Accordingly, no limitation on the present invention is implied by the identification of the above DSPs as useful to embodiments of the invention.

Referring again to FIG. 3, in one embodiment, the output of the system modeling filter 312 is the predicted sound pressure level 314 that would be generated by an acoustic transducer in response to the unattenuated input signal 302. In another embodiment, the sound pressure level 314 predicted by the system modeling filter 312 is normalized based on a predetermined frequency-dependent limit such that the output of the system modeling filter 312 is the amount, if any, by which the sound pressure level that would be generated by an acoustic transducer in response to an acoustic input signal, exceeds the predetermined limits. These and other equivalent approaches may be utilized in the present invention depending on the designer's preferences, features of the implementation technology, or application specific requirements.

Spectral Energy Detector

The predicted excess sound pressure level S(n) 314 from the system modeling filter 312 is passed to the spectral energy detector 399. The spectral energy detector 399 determines estimates of the time-weighted energy contained in the signal as a function of one or more spectral frequency bands. The present invention contemplates a variety of methods for decomposing the system modeling filter output into spectral bands including FFT methods, bandpass filtering and subband analysis. Regardless of the method chosen, a time averaging method is used to generate the time-weighted energy estimates. In one embodiment, the time-weighted energy estimate used is a running RMS calculation. The running RMS calculates the signal's energy by determining the root mean square energy in a defined time window that includes the current input sample and a number of past input values covering the range of time desired for the estimate. Depending on the embodiment, the size of the time window within which to perform the running RMS calculation can range from about 8 to 32 milliseconds.

The predicted excess sound pressure level 314 from the system modeling filter 312 is separated into one or more frequency bands. The number of frequency bands chosen is determined by balancing the level of signal quality and intelligibility ultimately output by the acoustic transducer, against the limitations of the computational resources available in the particular implementation (i.e., processing power, memory, etc.). In a system in which the output of the system modeling filter is analyzed as a single frequency band, all the averaged signal energy will be represented by a single value. This value can exceed the predetermined limits when the unattenuated signal has only a moderate time domain amplitude. Consequently, more attenuation would be required in order to meet the predetermined limits, resulting in lower signal quality and intelligibility. As the number of frequency bands into which the system modeling filter output is separated is increased, the total energy associated with the entire signal becomes distributed among more component values, each with lower value than any embodiment with fewer total frequency bands. As a result the required time-domain attenuation needed to meet the limiting requirements is less and the resulting acoustic output is more intelligible. Thus, increasing the number of frequency bands provides greater intelligibility while satisfying the constraints of the predetermined limits. However, increasing the number of frequency bands requires more computational resources including processing resources and memory. In one embodiment the number of frequency bands used is eight.

In another embodiment the functions of the spectral energy detector 399 are implemented as a bandpass filter bank 318 and an average energy detector bank 322. The input to the bandpass filter bank 318 is the predicted excess acoustic output S(n) 314 from the system modeling filter. The bandpass filter bank comprises a number of filters that spectrally decompose the output of the system modeling filter into a number of discrete frequency bands.

In one embodiment, the bandpass filter bank 318 is implemented with a number of standard DSP cascaded biquad IIR filter sections. In one embodiment, the bandpass filter bank comprises eight Butterworth filters with the characteristics and specifications shown in the table below. In this embodiment the band edges are chosen such that there are no gaps between the filter band edges, so that any or all of the signal's frequency components will be detected at full amplitude in at least one spectral band.

Filter Bank Specifications

| Band | Type | Order | −3 dB edges Low Frequency (Hz) | −3 dB edges High Frequency (Hz) |
|---|---|---|---|---|
| 1 | Butterworth Low Pass | 5 | — | 550 |
| 2 | Butterworth Band Pass | 6 | 375 | 1200 |
| 3 | Butterworth Band Pass | 6 | 800 | 1700 |
| 4 | Butterworth Band Pass | 6 | 1300 | 2200 |
| 5 | Butterworth Band Pass | 6 | 1800 | 2700 |
| 6 | Butterworth Band Pass | 6 | 2300 | 3200 |
| 7 | Butterworth Band Pass | 6 | 2800 | 3700 |
| 8 | Butterworth High Pass | 5 | 3500 | — |

The outputs 320 of the bandpass filter bank 318 are the predicted excess sound pressure levels associated with each of a number of discrete frequency bands. This is represented in FIG. 3 as the Filter(N, n) values where, N is the number of frequency bands used, and n is the time step.

Figure 5:
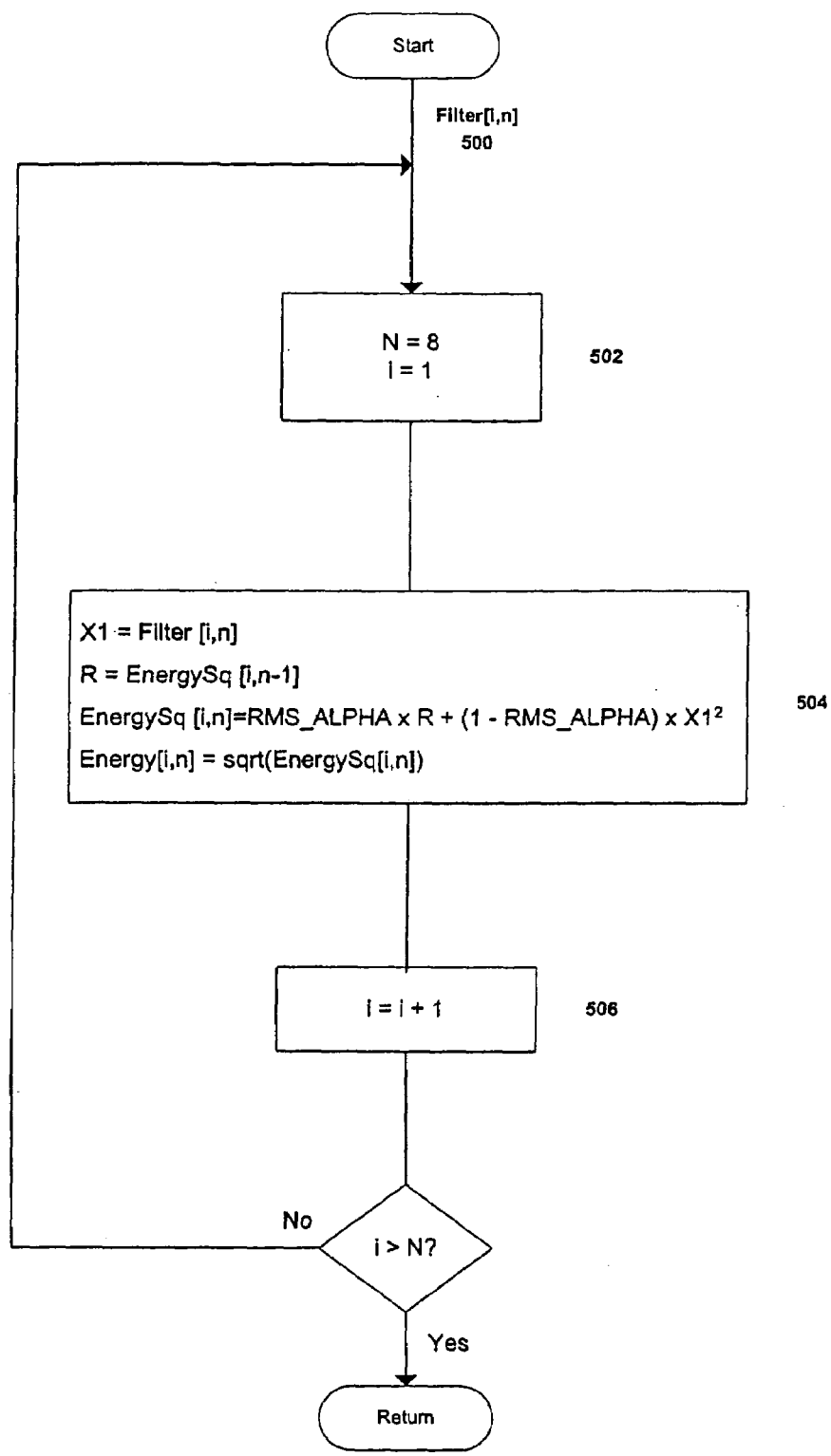
FIG. 5 is a flow chart showing the logic used in one embodiment of the average energy detector bank shown in FIG. 3.

In one embodiment shown in FIG. 5, the average acoustic energy calculation 504 for each frequency band is performed as a root mean squared (RMS) calculation of the predicted sound pressure level associated with each frequency band 320.

In a further embodiment, the average acoustic energy can be calculated as an approximation to the true value of each band's RMS energy. An approximation of the mean square power, EnergySq, of each frequency band of the predicted sound pressure level, Filter[i,n], is calculated in accordance with the equation:

$$\text{EnergySq}\,[i,n] = RMS\_ALPHA \times R + (1 - RMS\_ALPHA) \times X1^2,$$

where RMS_ALPHA is a constant designed to measure the RMS energy with the desired integration time. For RMS energy calculations the integration time is the period during which the squared energy of the signal is accumulated. In one embodiment an RMS_ALPHA value of 0.98047 is used to provide an RMS integration time of 16 ms.

The average acoustic energy associated with the excess sound pressure level, 324, for each frequency band is then calculated by taking the square root of EnergySq as shown in FIG. 5.

The outputs 324 of the spectral energy detector 399 are the time weighted averages 324, Energy[N,n], of the amount by which the acoustic energy associated with each of the discrete spectral bands exceeds the predetermined limits.

Peak Detector

Referring again to FIG. 3, the peak detector 316 receives as input the excess predicted sound pressure level 314 that is output from the system modeling filter 312, and determines the maximum instantaneous excess sound pressure level, PeakEnv(n) 340. In a DSP embodiment, the peak detector is implemented as a standard peak envelope detector which tracks and stores increasing values in the absolute amplitude of the input signal and then decreases at an exponential rate of decay when the input amplitude decreases in value. However, prior to decaying when the input amplitude starts decreasing, the peak detector holds the last peak value for a predetermined time period. In one embodiment the time constant used for the rate of exponential decay is 2.4 milliseconds and the predetermined amount of time during which each value of excess predicted sound pressure level is held constant before being allowed to decay is 0.5 milliseconds.

The output of the peak detector 316 is the maximum instantaneous amplitude 340, PeakEnv(n), of the excess predicted sound pressure level output from the system modeling filter.

Gain Logic Block

Figure 9:
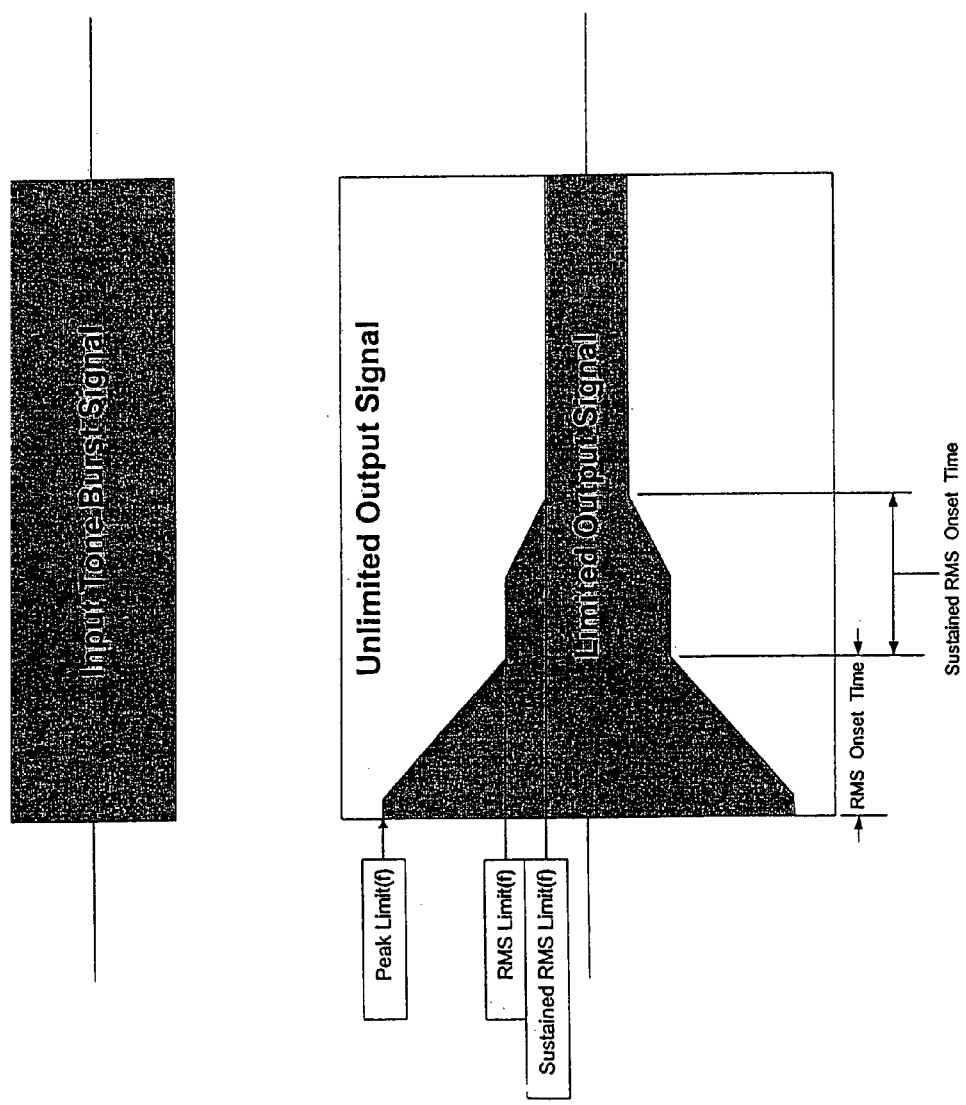
FIG. 9 is a diagram illustrating certain effects of imposing peak, average and sustained signal level limits on an input tone burst signal.

The outputs 324, of the spectral energy detector 399 and the peak detector 316 are passed to the gain logic block 341. The gain logic block provides the attenuation factor (or gain reductions) in a manner that adheres to the time schedules for gain changes imposed by the limiting specifications. These time schedules typically require that the sound pressure level be reduced to a certain maximum value within a fixed amount of time. This may be extended to require further output reduction as time continues. For example one set of limit specifications might require that the sound pressure level, measured at the DRP, adheres to the following three conditions: (1) the instantaneous sound pressure may never exceed a predetermined level (typical values of this level are 100 to 120 dBSPL); (2) the time-weighted RMS energy may never exceed a predetermined (and optionally frequency dependent) limit value (typical values for the RMS integration time are 8 to 32 ms and typical values for the RMS limit are 90 to 96 dBSPL); and (3) once the RMS value has reached the limit of (2) and if the signal continues to be over the limit, the RMS energy must be further decreased to a lower predetermined limit within a specified time. This is referred to as the sustained RMS limit. Typically this lower level is 82 to 88 dBSPL and typically the time to reach this limit is 32 to 200 milliseconds. FIG. 9 shows how the acoustic output signal would be limited given such a set of limiting requirements for, as an example, a single frequency tone burst. If the limit levels illustrated in the figure are required to be a function of frequency then for each frequency in the input signal the limits are different and the equivalent figure would have different attenuation levels.

The outputs of the spectral energy detector 399 and the peak detector 316 are passed to the gain logic block 341. The gain logic block uses the inputs 324, Energy[N,n], representing the time weighted average acoustic energy in each discrete frequency band, and the input 340, PeakEnv(n), to determine an instantaneous gain 346, G(n), to be applied to the unattenuated input signal in order to prevent the sound pressure level of an acoustic signal that would be generated by an acoustic transducer from exceeding predetermined limits.

In one embodiment, the gain logic block 341 comprises five components: (1) a maximum energy selector 326; (2) a sustained gain calculator 330; (3) an RMS gain calculator 334; (4) a peak gain calculator 342; and (5) a gain law state machine.

The maximum energy selector 326 determines the maximum value of the RMS energy levels, Energy[N,n], from among the N frequency bands and passes this value 327 to the sustained gain calculator 330 and the RMS gain calculator 334. Additionally the maximum energy selector keeps track of how long any of the N RMS energy values have been above the predetermined RMS limit. When any RMS energy within a single frequency band has exceeded the threshold for predetermined amount of time the SusHoldoffDone flag 328 is set and passed to the sustained gain calculator. This flag indicates that the excess signal level continues and that the gain logic block must therefore start further reducing the gain to meet the sustained output limits. In one embodiment the sustained hold off time is set to provide a 32 millisecond onset time to attain the sustained limit.

Figure 6:
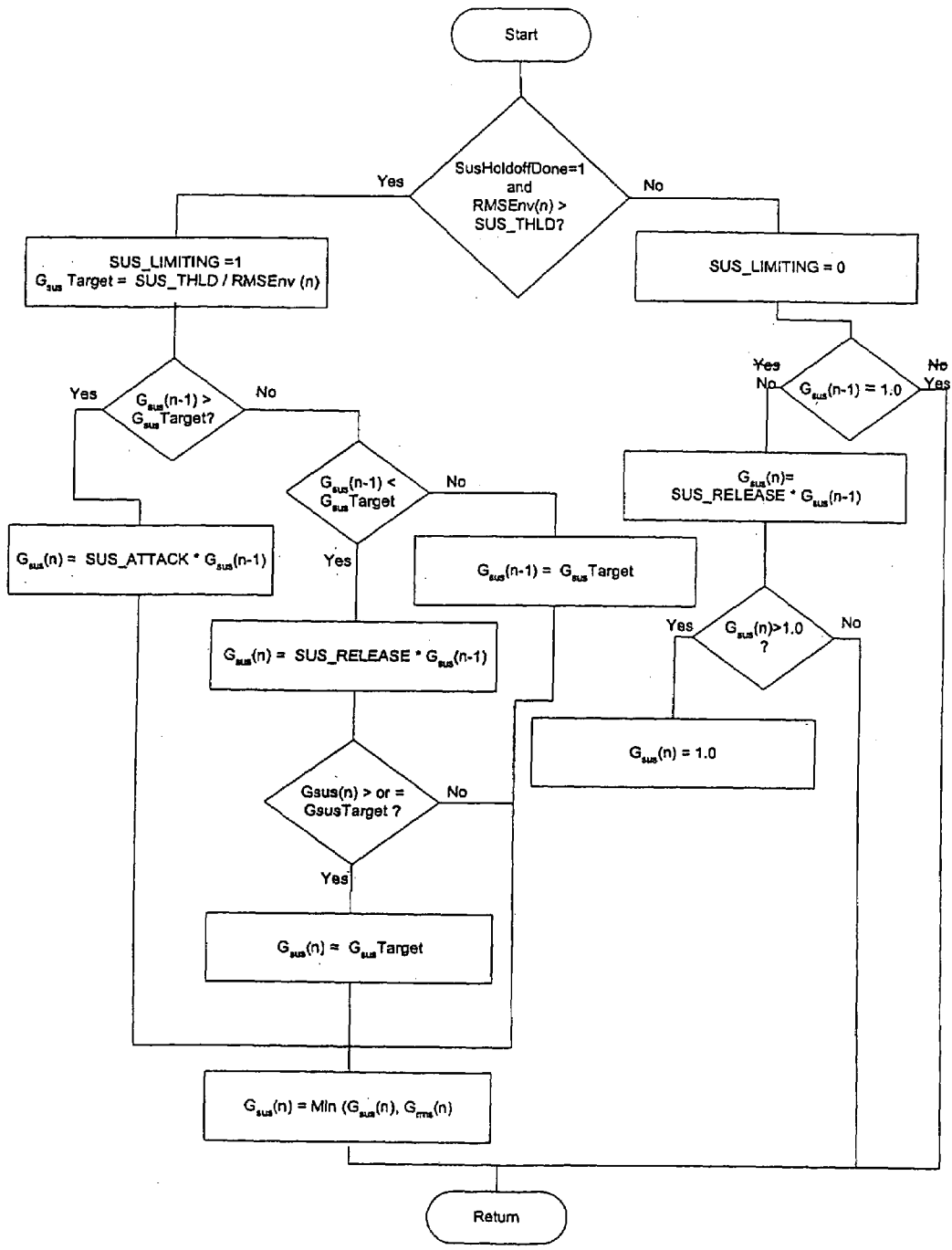
FIG. 6 is a flow chart showing the logic used in one embodiment of the sustained gain calculator module shown in FIG. 3.

The sustained gain calculator receives as input the flag 328 and the maximum of the RMS energy levels 327, RMSEnv(n), determined in the maximum energy selector 326, and determines the sustained gain 331, Gsus(n), that must be applied to the unattenuated signal to meet the sustained limit requirements including the time domain performance characteristics. Referring now to FIG. 6, if the flag, SusHoldDone, is set to true and RMSEnv(n), exceeds the predetermined sustained limit, then the target gain, GsusTarget(n), is set to the predetermined sustained limit value divided by RMSEnv(n). Then, depending on whether the past sample value of the gain, Gsus(n−1) is greater than, less than or equal to GsusTarget(n), then the gain for the subsequent time step, Gsus(n), is exponentially decreased to, exponentially increased to, or set equal to the target value, respectively. As a final step the sustained gain calculator sets the final value of Gsus(n) for the current sample time equal to the minimum of Gsus(n) and Grms(n) If either the flag, SusHoldDone, is false, or RMSEnv(n) does not exceed the predetermined sustained limit, then the gain, Gsus(n), is exponentially increased until it reaches a value of 1.0. Typical time constants for releasing the gain to unity are 5 to 100 ms. In one embodiment a release time of 35 ms is used.

Referring again to FIG. 3, the RMS gain calculator 334 receives as input the maximum of the RMS energy levels 327, RMSEnv(n), and determines the RMS gain, Grms(n), needed to prevent the unattenuated input signal from producing an acoustic signal with an average acoustic energy level which exceeds a predetermined RMS limit. If RMSEnv(n) exceeds the predetermined limit, then the RMS gain Grms(n) is set equal to the value of the predetermined limit divided by RMSEnv(n) which results in a value less than 1.0. If RMSEnv(n) is less than or equal the predetermined limit, then Grms(n) is set equal to 1.0.

The peak gain calculator 342 receives as input the maximum excess instantaneous sound pressure level 340, PeakEnv(n), that would be generated by an acoustic transducer in response to an unattenuated input signal, and determines the peak gain 344, Gpeak(n), needed to prevent the unattenuated input signal from producing an acoustic signal with an instantaneous peak acoustic energy which exceeds a predetermined peak limit. If PeakEnv(n) exceeds the predetermined limit, then the gain, Gpeak(n), is set equal to the value of the predetermined peak limit divided by PeakEnv(n), which results in a value less than 1.0. If PeakEnv(n) is less than or equal the predetermined limit, then Gpeak(n) is set equal to 1.0.

The gain law state machine 332 receives as input the sustained gain 331, Gsus(n), the RMS gain 333, Grms(n), and the peak gain 344, Gpeak(n), and determines which of these three gains should be used to calculate the gain applied to the unattenuated input signal. In one embodiment, the gain 346, G(n), selected by the gain law state machine is the lowest among the three gains, Gsus(n), Grms(n) and Gpeak(n) unless none of the three gain calculators have determined that any attenuation of the input signal is required; in which case G(n) is set to unity and no attenuation of the input signal occurs.

Gain Smoother

Referring again to FIG. 3, the gain smoother 348 receives as input the gain 346, G(n), output from the gain law state machine, and limits the rate at which G(n) can change. By limiting the rate of change of the gain that is applied to the input signal, the gain smoother 348 smoothly changes the gain over time without degrading the quality of the sound produced by the acoustic transducer in response to the input signal, or causing clipping or other undesirable acoustic artifacts.

Figure 7:
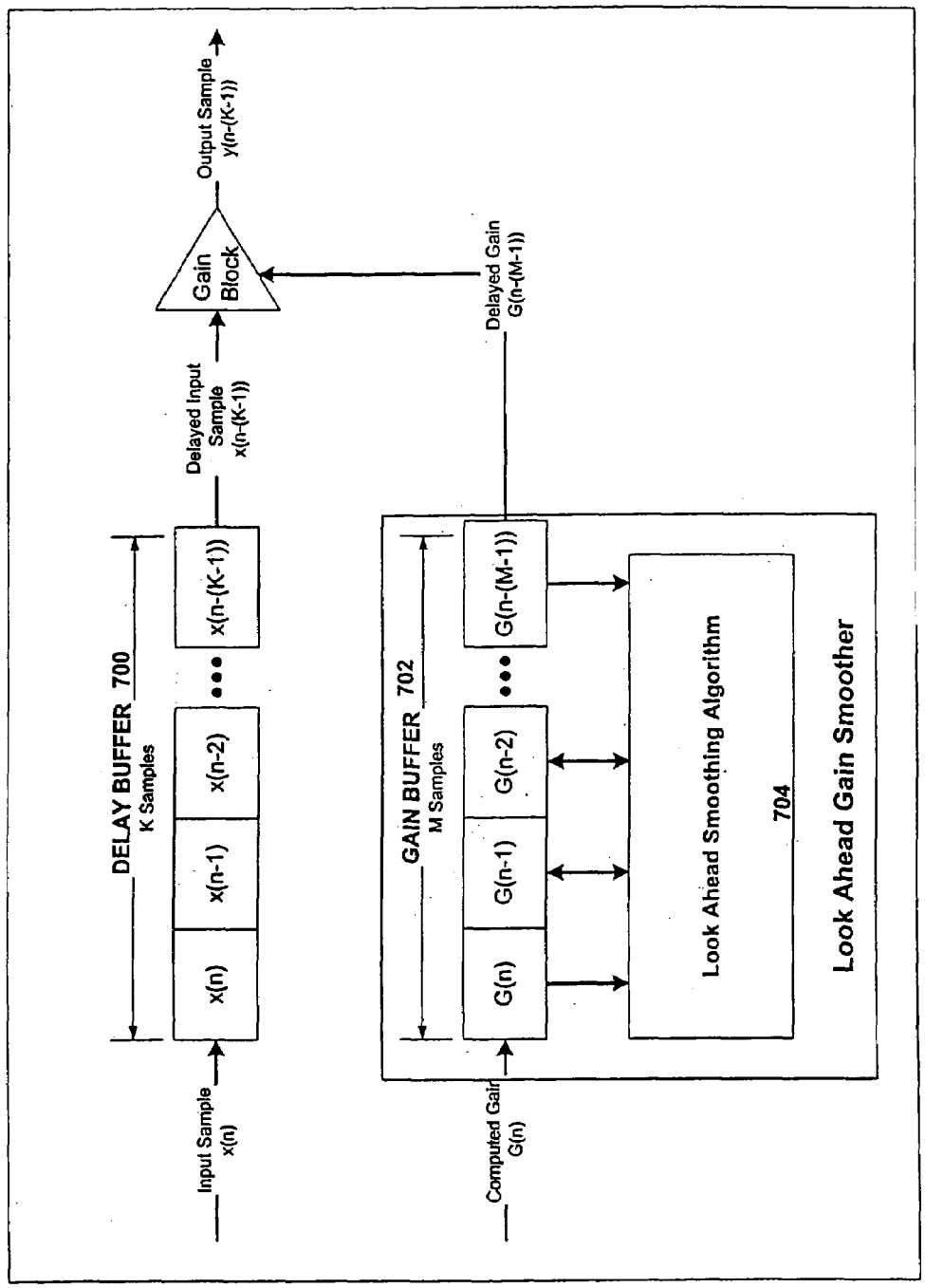
FIG. 7 is a diagram that shows logical representations of the delay buffer shown in FIG. 3, and the gain buffer incorporated into the look-ahead gain smoother shown in FIG. 3.
Figure 8:
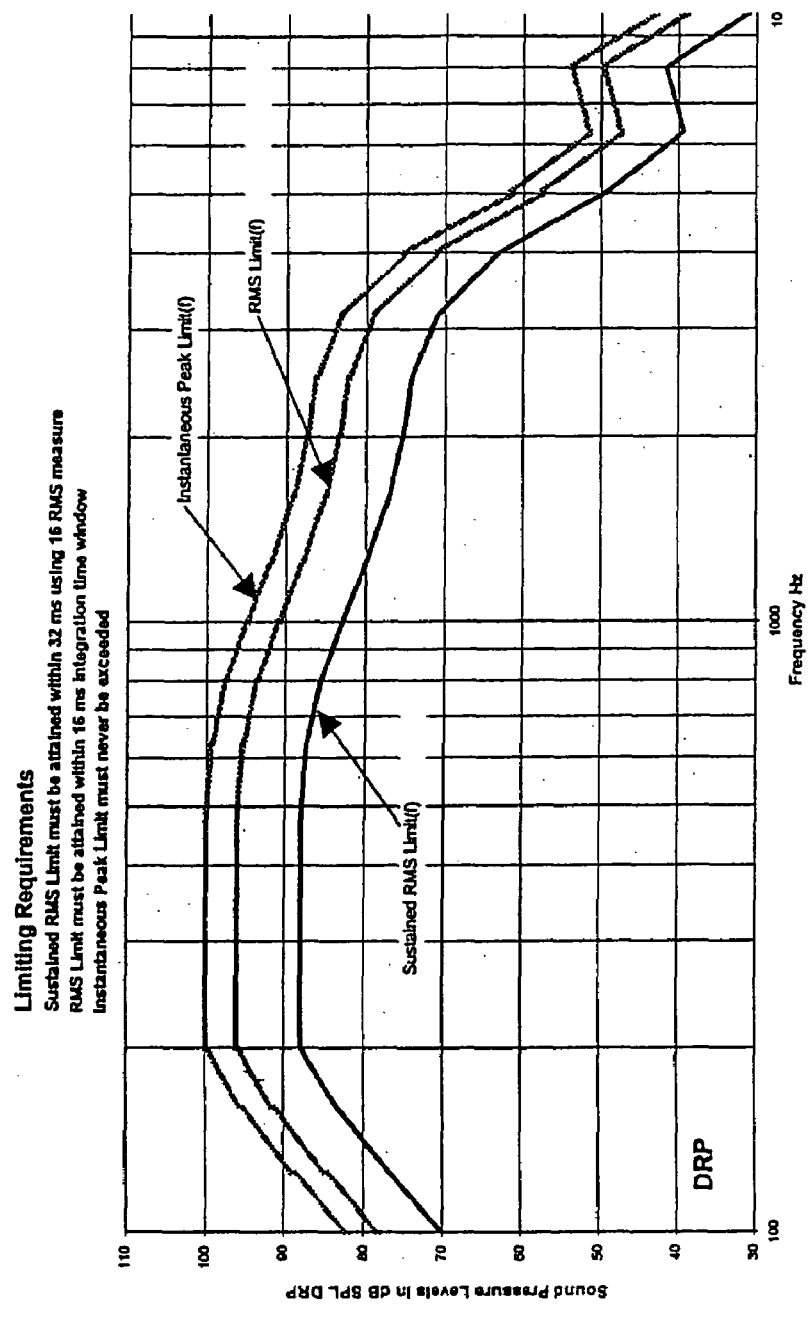
FIG. 8 is a diagram showing an example of a signal level limiting requirement that incorporates frequency dependent limits and time domain constraints.

At each time step, the gain smoother 348 interpolates between the current value of gain 350 being applied to the input signal 300 and the newly calculated gain value output 346 from the gain logic block 341. FIG. 7 shows one preferred embodiment of the gain smoother 348. As shown in FIG. 7, a gain buffer 702 is populated with intermediate gain values determined by interpolating between the value of the current gain and the newly calculated value. The interpolation method is defined by the look ahead smoothing algorithm 704. In the preferred embodiment the look ahead smoothing algorithm 704 works as follows. Each element of the gain buffer is compared to a linear interpolation between the most recently calculated gain value G(n) to the gain being currently applied to the delayed input signal G(n−(M−1)). The gain buffer element is updated with the interpolated value if it is smaller than the current value of the gain buffer element.

Other embodiments for the look ahead gain smoother algorithm 704 include calculating the intermediate gain values using a time-weighted averaging, polynomial or other non-linear curve fits, exponential interpolation, impulse interpolation and other interpolation methods.

The sizes of the delays and buffers for the input signal and the gains are designed to synchronize the arrival of the delayed input signal and the corresponding gain values. Referring again to FIG. 3, the output value 350 of the gain smoother 348 is thus passed to the gain block 310 at the appropriate time to be applied to the input signal sample 308 output from the delay buffer 306.

Gain Block

The gain block 310 applies the final gain 350 output from the gain smoother 348 to the time-delayed output of the unattenuated input signal 308. The resulting attenuated signal 352 is passed to the output node 354 and ultimately, for example, to an acoustic transducer.

The present invention has been described in particular detail with respect to one possible embodiment. Those of skill in the art will appreciate that the invention may be practiced in other embodiments. First, the particular naming of the components, signals, capitalization of terms, the attributes, data structures, or any other programming or structural aspect is not mandatory or significant, and the mechanisms that implement the invention or its features may have different names, formats, or protocols. Further, the system may be implemented in a digital signal processor, as described, or entirely in discrete analog elements. Also, the particular division of functionality between the various components described herein is merely exemplary, and not mandatory; functions performed by a single component may instead be performed by multiple components, and functions performed by multiple components may instead performed by a single component.

Some portions of the above description present the features of the present invention in terms of algorithms and symbolic representations of operations on various signals. These algorithmic descriptions and representations are the means used by those skilled in the data processing arts to most effectively convey the substance of their work to others skilled in the art. These operations, while described functionally or logically, are understood to be implemented by any variety of suitable structures, whether firmware, software, hardware, or a combination thereof. Furthermore, it has also proven convenient at times, to refer to these arrangements of operations as modules, code devices or elements, without loss of generality.

The invention claimed is:

1. An audio limiting circuit adapted to receive an unattenuated audio input signal and produce an attenuated, audio limited output signal, said audio limiting circuit comprising:
   1) a delay element for delaying the unattenuated input signal; and
   2) an attenuating circuit generating an attenuation to be applied to the unattenuated input signal, said attenuating circuit comprising a spectral energy detector for decomposing an input signal into spectral bands and determining a time weighted average energy measure of the amount by which an acoustic energy associated with each of the spectral bands exceeds a predetermined limit, wherein an instantaneous gain is determined from the time weighted average energy measure;
   3) a gain block for applying the instantaneous gain to the unattenuated input signal in order to prevent the sound pressure level of an acoustic signal that would be generated by an acoustic transducer from exceeding predetermined limits.

2. An audio limiting circuit comprising:
   1) an input node and an output node;
   2) an attenuation element between the input node and the output node, and comprising
      a) means for analyzing excess output sound pressure over a plurality of frequency bands and calculating an average acoustic energy associated with each frequency band;
      b) means for calculating gain from the average acoustic energy associated with each frequency band and
      c) means for calculating the amount by which to attenuate an input signal to maintain sound pressure levels generated by the acoustic transducer do not exceed predetermined frequency and time domain limits;
   3) a buffering element between the input node and the output node and parallel to the attenuation element; and
   4) means for applying the calculated gain to the buffered the audio input signal to attenuated the audio input signal.

3. An audio signal limiting circuit comprising a gain circuit and a delay circuit in parallel between an input node and an output node,
  1) said gain circuit comprising means for predicting sound pressure at the output node and including:
    a) means for splitting the input signal into frequency bands, means for determining an average energy associated with each of the frequency bands and means for determining the maximum energy frequency band, and means for calculating sustained gain and RMS gain from a maximum energy level associated with the maximum energy frequency band;
    b) peak detection means, and means for calculating peak gain from a maximum excess instantaneous sound pressure level;
    c) gain law state machine means for receiving said sustained gain, said RMS gain, and said peak gain and producing a calculated gain; and
    d) a look-ahead gain smoother for interpolating a gain between said calculated gain and a reference gain;
  2) said delay circuit comprising a delay buffer to produce a delayed input signal; and
  3) a gain block means adding the gain output from the gain smoother to the time-delayed output of the unattenuated input signal to form an attenuated output signal for passage to the output node.

4. A method of maintaining a sound pressure level of an acoustic signal that would be generated by an acoustic transducer from exceeding predetermined limits, comprising:
  1) delaying an unattenuated input signal; and
  2) determining an attenuation to be applied to the unattenuated input signal by spectrally decomposing an input signal 1 into spectral bands and determining a time weighted average energy measure of the amount by which an acoustic energy associated with each of the spectral bands exceeds a predetermined limit, wherein an instantaneous gain is determined from the time weighted average energy measure; and
  3) applying the instantaneous gain to the unattenuated input signal in order to prevent the sound pressure level of an acoustic signal that would be generated by an acoustic transducer from exceeding predetermined limits.

5. A method of preventing the sound pressure level of an input acoustic signal that would be generated by an acoustic transducer from exceeding predetermined limits,
  1) receiving an unattenuated input signal and buffering the unattenuated input signal element between the input node and the output node;
  2) attenuating an input signal by the steps of:
    a) analyzing excess output sound pressure over a plurality of frequency bands and calculating an average acoustic energy associated with each frequency band;
    b) calculating gain from the average acoustic energy associated with each frequency band and
    c) calculating the amount of a gain by which to attenuate an input signal to maintain sound pressure levels generated by the acoustic traducer do not exceed predetermined frequency and time domain limits; and
  3) applying the calculated gain to the buffered the audio input signal to attenuated the audio input signal.

6. A method of limiting an audio signal received at an input node and delivered to an output node comprising:
  1) said gain circuit comprising means for predicting sound pressure at the output node by:
    a) splitting the input signal into frequency bands, determining an average energy associated with each of the frequency bands and determining a maximum energy frequency band, and calculating a sustained gain and RMS gain from a maximum energy level associated with the maximum energy frequency band;
    b) detecting a peak energy, and calculating peak gain from a maximum excess instantaneous sound pressure level;
    c) receiving said sustained gain, said RMS gain, and said peak gain and producing a calculated gain; and
    d) interpolating a gain between said calculated gain and a reference gain;
  2) delaying the audio signal received at the input node and adding the interpolated to the-delayed unattenuated input signal to form an attenuated output signal for passage to the output node.

\* \* \* \* \*